(12) United States Patent
Habu et al.

(10) Patent No.: US 8,546,958 B2
(45) Date of Patent: Oct. 1, 2013

(54) PRESSURE-SENSITIVE ADHESIVE SHEET FOR PROTECTING SEMICONDUCTOR WAFER

(75) Inventors: Takashi Habu, Ibaraki (JP); Fumiteru Asai, Ibaraki (JP); Tomokazu Takahashi, Ibaraki (JP); Eiichi Imoto, Ibaraki (JP); Yuta Shimazaki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 4 days.

(21) Appl. No.: 13/223,629

(22) Filed: Sep. 1, 2011

(65) Prior Publication Data

US 2012/0056338 A1 Mar. 8, 2012

(30) Foreign Application Priority Data

Sep. 1, 2010 (JP) ................................. 2010-196252

(51) Int. Cl.
*H01L 23/52* (2006.01)
*H01L 23/48* (2006.01)

(52) U.S. Cl.
USPC ........................................................ 257/783

(58) Field of Classification Search
USPC ......................................................... 257/783
See application file for complete search history.

(56) References Cited

U.S. PATENT DOCUMENTS

| | | | |
|---|---|---|---|
| 4,935,488 A * | 6/1990 | Omatsu et al. ................ | 528/272 |
| 6,403,215 B1 * | 6/2002 | Kondo et al. ................. | 428/345 |
| 2006/0134406 A1 * | 6/2006 | Horigome et al. ........... | 428/343 |

FOREIGN PATENT DOCUMENTS

| | | | |
|---|---|---|---|
| EP | 999250 A2 * | 5/2000 | |
| JP | 2000-150432 A | 5/2000 | |
| JP | 2000-212524 A | 8/2000 | |

* cited by examiner

*Primary Examiner* — Luan C Thai
(74) *Attorney, Agent, or Firm* — Sughrue Mion, PLLC

(57) ABSTRACT

The present invention provides a pressure-sensitive adhesive sheet for protecting a semiconductor wafer, which does not cause curve (warpage) in the semiconductor wafer, when the semiconductor wafer is ground, is excellent in followability to a pattern, has adequate stress dispersibility in a grinding operation, suppresses the crack in a wafer and chipping in a wafer edge, and does not leave a residue of a tackiness agent on the surface of the wafer. The protective sheet has one face having tackiness, does not have an interface existing between a substrate and the tackiness agent and is made of one layer, and the pressure-sensitive adhesive sheet has different tack strengths on both faces from each other.

5 Claims, No Drawings

PRESSURE-SENSITIVE ADHESIVE SHEET FOR PROTECTING SEMICONDUCTOR WAFER

This application is claiming priority based on Japanese Patent Application No. 2010-196252 filed Sep. 1, 2010, the contents of all of which are incorporated herein by reference in their entirety.

BACKGROUND OF THE INVENTION

1. Field of the Invention

The present invention relates to a pressure-sensitive adhesive sheet for protecting a semiconductor wafer, which causes little warpage in a semiconductor wafer after a semiconductor wafer has been ground to be extremely thin or after a large diameter wafer has been ground.

2. Description of the Related Art

In recent years, along with the miniaturization of various electronic equipments and the popularization of an IC card, electronic parts such as a semiconductor wafer are desired to be further thinned. For this reason, the conventional semiconductor wafer having had the thickness of approximately 350 µm is needed to be thinned to approximately 30 µm or less. In addition, in order to enhance the productivity, it is investigated to further increase the diameter of the wafer.

Usually, in a process of manufacturing the semiconductor wafer, after a circuit pattern has been formed on the surface of the wafer, the rear face of the wafer is ground with a grinder or the like until the thickness of the wafer reaches a predetermined thickness. On this occasion, a pressure-sensitive adhesive sheet is generally affixed onto the surface of the wafer and then the rear face is ground, for the purpose of protecting the surface of the wafer. In addition, after the wafer has been worked into a thin type, the wafer is occasionally transported to a next step in a state of having the pressure-sensitive adhesive sheet affixed on its surface.

However, when the rear face has been ground to make the wafer extremely thin in such a state that the surface of the wafer has been protected by the pressure-sensitive adhesive sheet, the wafer which has been ground tends to easily cause warpage therein. The wafer which has caused the warpage therein has a problem of causing cracks therein while the wafer is transported and while the pressure-sensitive adhesive sheet is peeled from the wafer. This is considered to be because when the residual stress of the pressure-sensitive adhesive sheet exceeds the strength of the wafer as a result of having ground the rear face of the wafer having the pressure-sensitive adhesive sheet affixed thereon, the wafer is warped by such a force as to cancel the residual stress.

This warpage of the wafer which has been ground is considered to occur largely due to the influence of the residual stress remaining in the pressure-sensitive adhesive sheet. It is considered that this residual stress in the pressure-sensitive adhesive sheet constituted by a substrate and a tackiness agent is mainly formed in a step of coating the substrate with the tackiness agent or a manufacturing step of affixing a tackiness agent layer to the substrate and a step of sticking the pressure-sensitive adhesive sheet to the wafer, and when the wafer having the pressure-sensitive adhesive sheet affixed thereon in which the residual stress exists is ground to become extremely thin, the residual stress in the pressure-sensitive adhesive sheet exceeds the strength of the wafer and causes the warpage in the wafer due to such a force as to cancel the residual stress. In addition, therefore, in order to reduce this residual stress, various improvements have been made on the constitution of the pressure-sensitive adhesive sheet, and such a constitution as not to cause the residual stress has been proposed. For instance, Japanese Patent Laid-Open No. 2000-212524 proposes a pressure-sensitive adhesive sheet for protecting a semiconductor wafer, which is constituted by a substrate film and a tackiness agent layer and in which a modulus of tensile elasticity of the substrate film is 0.6 GPa.

In addition, Japanese Patent Laid-Open No. 2000-150432 proposes a pressure-sensitive adhesive sheet for use in working a semiconductor wafer, which is formed of a substrate and a tackiness agent layer formed on the substrate and in which the percentage of stress relaxation is 40% or more after 1 minute in an extension of 10% in a tensile test of the pressure-sensitive adhesive sheet.

The pressure-sensitive adhesive sheet to be affixed on the surface of the semiconductor wafer is generally formed by a constitution of a substrate layer and a tackiness agent layer. Such a pressure-sensitive adhesive sheet is manufactured by directly coating the substrate with the tackiness agent and affixing the substrate onto a separator or coating the separator with the tackiness agent and affixing the separator onto the substrate, in the manufacturing step. However, on this occasion, the substrate and the separator need to be stretched by some extent of tension so as not to hang slack, and accordingly a stress unavoidably occurs when the substrate and the separator are affixed to each other.

The substrate is also used for the purpose of enhancing supporting properties so that the pressure-sensitive adhesive sheet supports the semiconductor wafer to enhance the handleability.

When the pressure-sensitive adhesive sheet is affixed onto the surface of the wafer, the wafer is mounted on an affixing table so that the surface of the wafer faces upward, and the pressure-sensitive adhesive sheet is supplied thereon in such a state that the tackiness agent layer faces downward, while being pulled along the direction to be affixed so as not to hang slack, by using an affixing machine. Thus, the pressure-sensitive adhesive sheet is affixed to the wafer, by facing the tackiness agent layer of the pressure-sensitive adhesive sheet to the surface of the wafer, and sequentially crimping the substrate side of the pressure-sensitive adhesive sheet to the wafer along the direction to be affixed, with pressing means such as a crimping roll.

At this time as well, a force of pulling the pressure-sensitive adhesive sheet along the direction to be affixed and a force of crimping the pressure-sensitive adhesive sheet to the wafer are applied to the pressure-sensitive adhesive sheet, and accordingly when the pressure-sensitive adhesive sheet is affixed to the wafer, these forces remain in the pressure-sensitive adhesive sheet in a form of a residual stress.

In fact, various characteristics of these pressure-sensitive adhesive sheets as described in the above described Patent Documents are not necessarily optimal as one which suppresses the warpage of the wafer that has been ground when the semiconductor wafer is ground to be extremely thin or when a large diameter wafer is ground. For this reason, it has been desired to provide a pressure-sensitive adhesive sheet for protecting the semiconductor wafer, which can more effectively suppress the warpage of the wafer that has been ground.

Along with the recent tendency of extremely thinning the thickness of the ground wafer, it has also been desired that the wafer does not cause cracks in the wafer and chipping in the edge portion of the wafer due to the stress during the grinding operation. Though the pressure-sensitive adhesive sheet must be peeled from the wafer after the grinding operation, it has also been desired at this time that the tackiness agent does not remain on a circuit pattern on the surface of the wafer, and that there is no contamination at a molecular level on the surface of the wafer, which originates in the pressure-sensitive adhesive sheet, the semiconductor wafer and the like.

In addition, when the pressure-sensitive adhesive sheet having two or more layers including a substrate is used for fixing the wafer during a dicing operation, a so-called lump occurs that is a fine lump of the tackiness agent layer, which attaches to a blade and the pressure-sensitive adhesive sheet due to the change of a force applied to the blade and the like occurring in the interface between the two or more layers, because these layers have different elastic modulus from each other. The lump having attached to the blade or the pressure-sensitive adhesive sheet attaches to the wafer or the pressure-sensitive adhesive sheet in the subsequent step, and occasionally has made the cutting thereof difficult or has caused a crack in the wafer.

Furthermore, the pressure-sensitive adhesive sheet has caused a warpage of the semiconductor wafer and the like, and water and the like have occasionally intruded between the semiconductor wafer and the pressure-sensitive adhesive sheet when the semiconductor wafer has been washed with water or the like. For this reason, it has been required that the pressure-sensitive adhesive sheet shows stress relaxation properties, the tackiness agent layer of the pressure-sensitive adhesive sheet can sufficiently follow unevenness provided on the surface of the wafer, and lifting does not occur in the pressure-sensitive adhesive sheet by a shearing force in a cutting operation.

An object of the present invention is to provide a pressure-sensitive adhesive sheet for a semiconductor wafer, which does not cause warpage in the semiconductor wafer, even when the semiconductor wafer is ground to be extremely thin or a large diameter wafer is ground, is excellent in followability to a pattern, does not cause lifting from the pattern due to elapsing time, has adequate stress dispersibility in a grinding operation, suppresses the crack in a wafer and chipping in a wafer edge, does not cause peeling in the interlayer in a peeling operation, does not leave a residue of the tackiness agent on the surface of the wafer, and besides, does not produce a so-called lump made from the tackiness agent in a cutting operation.

SUMMARY OF THE INVENTION

1. A pressure-sensitive adhesive sheet for a semiconductor wafer, which is affixed onto a surface of the semiconductor wafer, the pressure-sensitive adhesive sheet being made of one layer formed of an acrylic urethane resin without having a substrate layer existing therein.
2. The pressure-sensitive adhesive sheet for the semiconductor wafer according to aspect 1, wherein the pressure-sensitive adhesive sheet has a percentage of stress relaxation of 40% or more in an extension of 10%.
3. The pressure-sensitive adhesive sheet for the semiconductor wafer according to aspect 1 or 2, wherein when the pressure-sensitive adhesive sheet has been stuck to a step of 30 μm, the lifting breadth of the tape after 24 hours shows an increase ratio of 40% or less compared to that in the initial state.
4. The pressure-sensitive adhesive sheet for the semiconductor wafer according to any one of aspects 1 to 3, wherein the pressure-sensitive adhesive sheet has a thickness of 5 μm to 1,000 μm.
5. The pressure-sensitive adhesive sheet for the semiconductor wafer according to any one of aspects 1 to 4, wherein the pressure-sensitive adhesive sheet has different tack strengths on both faces from each other.

DETAILED DESCRIPTION OF THE PREFERRED EMBODIMENTS (Whole Constitution of the Pressure-Sensitive Adhesive Sheet According to the Present Invention)

The present invention provides a pressure-sensitive adhesive sheet for a semiconductor wafer to be manufactured so as to have no substrate, thereby have no interface existing between the substrate and a tackiness agent, and be made of one layer, by adopting the above described constitution.

Here, the pressure-sensitive adhesive sheet having no substrate, thereby having no interface existing between the substrate layer and the tackiness agent layer and being made of one layer means a state of using no substrate film for carrying a tackiness agent layer thereon as was described in the above described background art. However, the state does not eliminate a state that the tackiness agent layer is laminated with another layer than the substrate, in other words, the tackiness agent layer is laminated with a layer which does not function as the substrate, but includes a state in which the existence of a thin layer in such a grade that the whole pressure-sensitive adhesive sheet does not have a residual stress therein is permitted.

Because this pressure-sensitive adhesive sheet is a pressure-sensitive adhesive sheet which can alleviate the stress, the residual stress which occurs in a manufacturing step of a pressure-sensitive adhesive tape and an affixing step of the pressure-sensitive adhesive sheet also becomes very small. Because of this, by grinding the rear face of a semiconductor wafer with the use of such a pressure-sensitive adhesive sheet, the warpage of the wafer that has been ground can be reduced, which is different from the case in which a pressure-sensitive adhesive sheet having a substrate has been used.

Furthermore, when the pressure-sensitive adhesive sheet having no substrate is cut by a blade, the blade does not need to cut two layers having different hardness, percentage of elongation or the like, and accordingly can cut the pressure-sensitive adhesive sheet while moving in a layer direction of the pressure-sensitive adhesive sheet with the same force and the same stress. Accordingly, it becomes possible to prevent the occurrence of a so-called lump that is a fine lump of the tackiness agent layer, which attaches to the blade or the pressure-sensitive adhesive sheet due to the change of a force applied to the blade and the like occurring in the interface of the layers, as in the case where the sheet made of two layers is cut, so that the blade and the pressure-sensitive adhesive sheet having the lump attached thereon do not make the cutting of the wafer and the pressure-sensitive adhesive sheet difficult in the subsequent step.

The pressure-sensitive adhesive sheet made of one layer according to the present invention, which does not have a substrate layer existing therein, is preferably a pressure-sensitive adhesive sheet which contains a urethane polymer and acrylic polymer as a base resin. When the pressure-sensitive adhesive sheet is a type made of one layer of an ultraviolet-curable type, which is formed from a polymer containing a urethane polymer and acrylic monomer polymerizable compound as a base resin, a residual stress does not occur in a stretching step to be conducted when forming the substrate film and in a manufacturing step of directly coating the substrate with a tackiness agent or affixing a sheet on which the tackiness agent has been transferred to the substrate, as are seen in a usual manufacturing step of a pressure-sensitive adhesive sheet, and when the wafer has been ground to be extremely thin, the warpage of the wafer can be reduced as was described above.

The pressure-sensitive adhesive sheet made of one layer also shows an effect of reducing such a risk that peeling occurs in the interlayer between the substrate and the tackiness agent in a peeling operation and the paste remains on a pattern surface, when the pressure-sensitive adhesive sheet made of one layer is peeled from a semiconductor wafer after the rear face thereof has been ground, because the pressure-sensitive adhesive sheet made of one layer has no interface between the substrate and the tackiness agent layer.

As for a method of obtaining an acrylic urethane resin which is used for the pressure-sensitive adhesive sheet according to the present invention, it is acceptable to form a blend of an acrylic resin and a urethane resin by dissolving a urethane polymer into an acrylic monomer and polymerizing the solution, and it is also acceptable to form a copolymer of the acrylic and urethane polymers by introducing an unsaturated bond into a urethane polymer beforehand, and making this unsaturated bond react with an acrylic monomer.

As was described above, the pressure-sensitive adhesive sheet according to the present invention has almost no stress remaining in the pressure-sensitive adhesive sheet in a manufacturing step, but a stress results in remaining in the pressure-sensitive adhesive sheet when the pressure-sensitive adhesive sheet is stuck to a wafer. In addition, the pressure-sensitive adhesive sheet is made of one layer and has no substrate layer. Accordingly, in consideration of followability to a pattern, it is desirable that the pressure-sensitive adhesive sheet has a percentage of stress relaxation of 40% or more in an extension of 10%. By having the percentage of stress relaxation of 40% or more, the pressure-sensitive adhesive sheet can suppress also the warpage of the wafer due to the influence of the stress formed in a sticking operation.

In addition, most of usual tackiness agents have modulus of tensile elasticity of 1 MPa or less, but have a small percentage of stress relaxation of approximately 40% or less, and tend to lift from a wafer pattern to which the tackiness agent has followed after having been stuck thereto, with elapsed time. However, in the pressure-sensitive adhesive sheet which is made of one layer and has a percentage of stress relaxation of 40% or more in an extension of 10%, the amount of the lifting due to the elapsed time is reduced.

The thickness of the pressure-sensitive adhesive sheet of one layer is preferably 5 µm to 1,000 µm, more preferably is 10 µm to 500 µm, and further preferably is 30 µm to 250 µm.

When the thickness of the pressure-sensitive adhesive sheet of one layer is in such a range, the pressure-sensitive adhesive sheet can sufficiently protect the surface of the semiconductor wafer when the rear face thereof is ground. When the thickness of the pressure-sensitive adhesive sheet of one layer is less than 5 µm, the pressure-sensitive adhesive sheet follows even the small unevenness of the surface of the wafer and cannot protect the surface, and the wafer occasionally results in being cracked when being ground. When the thickness of the pressure-sensitive adhesive sheet of one layer exceeds 1,000 µm, the thickness is not preferable in terms of tape-cut easiness after the pressure-sensitive adhesive sheet has been stuck and workability in the device.

The pressure-sensitive adhesive sheet according to the present invention may have the same tack strength in both faces but have different tack strengths from each other in both faces. When the pressure-sensitive adhesive sheet has the same tack strength in both faces, the pressure-sensitive adhesive sheet can be used as a protection sheet for dicing, and the pressure-sensitive adhesive sheet having the different tack strengths from each other in both faces can be used when an object needs different tack strengths from each other in both faces of the pressure-sensitive adhesive sheet. In order to impart different tack strengths from each other to both faces of the above described pressure-sensitive adhesive sheet, it is possible to make the tack of one face disappear by subjecting only the face to non-tackiness treatment. The particularly preferable method is a method of lowering the tack strength and making the one face less tacky by subjecting the surface of only one face to a surface treatment of forming unevenness or making silica particles or the like deposit on the surface.

In the case of the pressure-sensitive adhesive sheet made of one layer, if one face is not subjected to the non-tackiness treatment, there is a concern that the pressure-sensitive adhesive sheet adheres and sticks to a transportation arm or a table when the semiconductor wafer is transported, and accordingly it is desirable to subject the one face of such a pressure-sensitive adhesive sheet for protecting the semiconductor wafer to the non-tackiness treatment so that the semiconductor wafer can be transported in a grinding step for its rear face and also after the grinding step without making the pressure-sensitive adhesive sheet stick to the arm or the table.

It is possible to make one face of the pressure-sensitive adhesive sheet for protecting the semiconductor wafer according to the present invention non-tacky or less tacky, by coating a separator having adequate thickness accuracy (particularly, PET separator or the like) with an ultraviolet-curable type prepolymer in a usual way, irradiating the coated face with ultraviolet rays in a state of having covered the coated face with an uneven separator, for instance, and thereby transferring the unevenness of the uneven separator onto the one surface of the pressure-sensitive adhesive sheet.

It is also possible to make the one face of the pressure-sensitive adhesive sheet less tacky or non-tacky by subjecting the one face to fluorination treatment or the like.

(Tackiness Agent)

The pressure-sensitive adhesive sheet is adjusted by appropriately combining a composition of a base polymer which is a tackiness agent, a type of a crosslinking agent, a blending ratio and the like. An initial elastic modulus and a tack strength of a pressure-sensitive adhesive sheet can be controlled, for instance, by controlling the Tg and crosslink density of the base polymer.

The pressure-sensitive adhesive sheet can employ, for instance, an ultraviolet-curable type substance. Among the resins, it is preferable to use a urethane polymer and a vinyl polymer as active ingredients or a resin formed of a copolymer of the urethane polymer and the vinyl monomer, from the viewpoint of adhesiveness to a semiconductor wafer, and a cleanability of the semiconductor wafer from which the pressure-sensitive adhesive sheet has been peeled, by an ultrapure water or an organic solvent such as alcohol.

The pressure-sensitive adhesive sheets having various characteristics can be obtained by appropriately selecting a composition of a urethane polymer, types and compositions of a vinyl polymer and a vinyl monomer, a blending ratio of the urethane polymer to the vinyl polymer and the like, and also by further combining a crosslinking agent and the like appropriately with the above compounds.

In the present invention, the pressure-sensitive adhesive sheet can be obtained, for instance, by solution-polymerizing or emulsion-polymerizing the vinyl monomer in the presence of the urethane polymer. The vinyl polymer which constitutes the pressure-sensitive adhesive sheet is preferably an acrylic polymer, and in this case, a material made of the acrylic urethane resin can be obtained by solution-polymerizing the acrylic monomer.

The pressure-sensitive adhesive sheet according to the present invention may also be formed by using a vinyl monomer which works as a radical-polymerizable monomer, as a diluent, forming a urethane polymer in this radical-polymerizable monomer, applying the mixture which contains the radical-polymerizable monomer and the urethane polymer as a main component onto the separator, and irradiating the mixture with a radiation to cure the mixture. Here, the radical-polymerizable monomer to be used includes a monomer having a radical-polymerizable unsaturated double bond, and includes the vinyl monomer and the like, but is preferably an acrylic monomer from the viewpoint of reactivity.

Specifically, a urethane-acrylic composite material can be obtained by (a) making a polyol react with a diisocyanate to synthesize a urethane polymer, then dissolving this reaction product into the acrylic monomer, adjusting the viscosity, coating a first film with the solution, and curing the wet film with the use of a low-pressure mercury lamp or the like. It is possible to form a polymer having a vinyl group in a terminal end as the above urethane polymer and thereby copolymerize the polymer with an acrylic monomer.

In addition, the urethane-acrylic composite material can also be obtained by (b) dissolving a polyol in an acrylic monomer, then making the polyol react with a diisocyanate to synthesize a urethane polymer, also adjusting the viscosity, coating a first film with the solution, and curing the wet film with the use of a low-pressure mercury lamp or the like. On this occasion, if a urethane polymer having a vinyl group in a terminal end is synthesized by the addition, for instance, of a hydroxyl-group-containing vinyl monomer, the vinyl group can be copolymerized with the acrylic monomer.

In these methods, the acrylic monomer may be added at a time during the synthesis of the urethane, and may also be added at several divided times. In addition, it is also acceptable to dissolve the diisocyanate into the acrylic monomer and then make the diisocyanate react with the polyol.

Here, the method (a) has such a defect that the molecular weight of the polyurethane is unavoidably limited because when the molecular weight of polyurethane to be produced through the reaction between the polyol and the diisocyanate becomes high, it becomes difficult to dissolve the polyurethane into the acrylic monomer.

On the other hand, according to the method (b), the molecular weight of the urethane to be finally obtained can be designed so as to become an arbitrary size, because the molecular weight is not limited and polyurethane with a high molecular weight can also be produced.

In addition, it is also possible to obtain a urethane-acrylic resin material by (c) previously dissolving a separately-prepared urethane polymer into an acrylic monomer, coating a first film with the solution, and curing the wet film with the use of a low-pressure mercury lamp or the like.

(Acrylic Monomer)

An acrylic monomer which is preferably used in the present invention includes, for instance, (meth)acrylic acid, methyl (meth)acrylate, ethyl (meth)acrylate, propyl (meth)acrylate, butyl (meth)acrylate, pentyl (meth)acrylate, hexyl (meth)acrylate, 2-ethylhexyl (meth)acrylate, octyl (meth)acrylate, isooctyl (meth)acrylate, nonyl (meth)acrylate, isononyl (meth)acrylate and isobornyl (meth)acrylate.

Together with these esters, monomers can be used which include a monomer having a carboxyl group, such as maleic acid and itaconic acid, and a monomer having a hydroxyl group, such as 2-hydroxyethyl acrylate, 2-hydroxyethyl methacrylate, 4-hydroxybutyl (meth)acrylate and 6-hydroxyhexyl (meth)acrylate.

It is also acceptable to copolymerize monomers such as vinyl acetate, vinyl propionate, styrene, acrylamide, methacrylamide, a monoester or diester of maleic acid, a derivative thereof, N-methylolacrylamide, glycidyl acrylate, glycidyl methacrylate, N,N-dimethylaminoethyl acrylate, N,N-dimethylaminopropyl methacrylamide, 2-hydroxypropyl acrylate, acryloyl morpholine, N,N-dimethylacrylamide, N,N-diethylacrylamide, imide acrylate, N-vinyl pyrrolidone, oligoester acrylate, ε-caprolactone acrylate, dicyclopentanyl (meth)acrylate, dicyclopentenyl (meth)acrylate, methoxydized cyclododecatriene acrylate, and methoxyethyl acrylate. The type and the amount of these monomers to be used which are copolymerized are appropriately determined in consideration of the characteristics and the like of a composite film.

In the present invention, another polyfunctional monomer in such a range as not to impair the characteristics can also be added as needed. The polyfunctional monomer includes ethylene glycol di(meth)acrylate, propylene glycol di(meth)acrylate, hexanediol di(meth)acrylate, neopentyl glycol di(meth)acrylate, trimethylolpropane tri(meth)acrylate, pentaerythritol tri(meth)acrylate, dipentaerythritol hexa(meth)acrylate, urethane acrylate, epoxy acrylate and polyester acrylate, and is particularly preferably trimethylolpropane tri(meth)acrylate. These monomers are also included in a radical-polymerizable monomer according to the present invention.

The type, the combination, the amount to be used and the like of these radical-polymerizable monomers are appropriately determined in consideration of compatibility with urethane, polymerizability when being cured with light such as a radiation and characteristics of a high molecular weight polymer to be obtained.

(Urethane Polymer)

A urethane polymer is obtained by making a polyol react with a polyisocyanate. A catalyst may also be used for a reaction of an isocyanate with a hydroxyl group of the polyol. A catalyst can be used which is generally used in a urethane reaction, for instance, such as dibutyltin dilaurate, tin octoate and 1,4-diazabicyclo(2,2,2)octane.

The polyol is desirably a polyol having two or more hydroxyl groups in one molecule. A low molecular-weight polyol includes: a divalent alcohol such as ethylene glycol, diethylene glycol, propylene glycol, butylene glycol and hexamethylene glycol; a trivalent alcohol such as trimethylol propane and glycerin; and a tetravalent alcohol such as pentaerythritol.

In addition, a high molecular-weight polyol includes: a polyether polyol obtained by addition-polymerizing ethyleneoxide, propylene oxide, tetrahydrofuran or the like; a polyester polyol formed of a condensation polymer which is obtained by condensation-polymerizing an alcohol such as the above described divalent alcohol, dipropylene glycol, 1,4-butanediol, 1,6-hexanediol and neopentyl glycol with a divalent basic acid such as an adipic acid, an azelaic acid and a sebacic acid; acrylic polyol; carbonate polyol; epoxy polyol; and caprolactone polyol. Among these polyols, the polyether polyol and the polyester polyol are preferable.

The acrylic polyol includes a copolymer of a hydroxyl-group-containing substance and an acrylic monomer, in addition to a copolymer of a monomer having a hydroxyl group, such as hydroxyethyl (meth)acrylate and hydroxypropyl (meth)acrylate. The epoxy polyol includes an amine-modified epoxy resin. These polyols can be used solely or concomitantly with another polyol. When the strength is needed, it is effective to introduce a cross-linked structure by triol or increase the amount of a urethane hard segment by a low molecular-weight diol. When the elongation is regarded as important, a diol with a large molecular-weight is preferably used solely. The polyether polyol is generally inexpensive and has adequate water resistance, and the polyester polyol has high strength. In the present invention, the type and the amount of the polyol can be freely selected according to the application and the purpose, and the type, the molecular weight and the amount to be used of the polyol can be appropriately selected also from the viewpoint of characteristics of the film to which the tackiness agent is applied, reactivity with the isocyanate, compatibility with the acrylic and the like.

The polyisocyanate includes an aromatic, an aliphatic and an alicyclic diisocyanate, and a dimer and a trimer of these diisocyanates. The aromatic, the aliphatic and the alicyclic diisocyanates include tolylene diisocyanate, diphenylmethane diisocyanate, hexamethylene diisocyanate, xylylene diisocyanate, hydrogenated xylylene diisocyanate, isophorone diisocyanate, hydrogenated diphenylmethane diisocyanate, 1,5-naphthylene diisocyanate, 1,3-phenylene diisocyanate, 1,4-phenylene diisocyanate, butane-1,4-diisocyanate, 2,2,4-trimethyl hexamethylene diisocyanate, 2,4,4-trimethyl hexamethylene diisocyanate, cyclohexane-1,4-diisocyanate, dicyclohexylmethane-4,4-diisocyanate, 1,3-bis(isocyanatemethyl)cyclohexane, methyl cyclohexane diisocyanate, and m-tetramethyl xylylene diisocyanate.

In addition, a dimer and a trimer of these diisocyanates, and polyphenylmethane polyisocyanate are used. The trimer includes an isocyanurate type, a burette type and an allophanate type, and these trimers can be appropriately used.

These polyisocyanates can be used solely or concomitantly with another polyisocyanate. The type, the combination and the like of the polyisocyanate may be appropriately selected from the viewpoint of urethane reactivity, compatibility with acrylic and the like.

In the present invention, the urethane polymer is formed preferably by using at least one diisocyanate selected from the group consisting of hexamethylene diisocyanate (HDI), hydrogenated tolylene diisocyanate (HTDI), hydrogenated 4,4-diphenylmethane diisocyanate (HMDI), isophorone diisocyanate (IPDI) and hydrogenated xylene diisocyanate (HXDI).

When the above described urethane polymer is synthesized, a hydroxyl-group-containing acrylic monomer may also be added as a hydroxyl-group-containing vinyl monomer. By adding the hydroxyl-group-containing acrylic monomer, a (meth)acryloyl group can be introduced into a terminal end of a molecular of a urethane prepolymer, copolymerizability with the acrylic monomer is imparted, the compatibility of a urethane component with an acrylic component increases, and S—S characteristics such as breaking strength can be also enhanced. The hydroxyl-group-containing acrylic monomer to be used includes hydroxyethyl (meth)acrylate, hydroxypropyl (meth)acrylate, hydroxybutyl (meth)acrylate and hydroxyhexyl (meth)acrylate. The amount of the hydroxyl-group-containing acrylic monomer to be used is preferably 0.1 to 10 parts by weight with respect to 100 parts by weight of the urethane polymer, and further preferably is 1 to 5 parts by weight.

Thus obtained urethane acrylic resin is not a blend of the urethane resin and the acrylic resin, but becomes an integral polymer formed by a copolymerization of a (meth)acryloyl group in a terminal end of the urethane polymer with a main chain of the acrylic resin.

In the present invention, the amounts of the polyol component and the polyisocyanate component to be used for forming the urethane polymer are not limited in particular, but the amount of the polyol component to be used preferably satisfies, for instance, a condition that NCO/OH (equivalence ratio) with respect to the polyisocyanate component is 0.8 or more, and further preferably satisfies that the NCO/OH is 0.8 or more and 3.0 or less. When the NCO/OH is less than 0.8, the molecular chain length of the urethane polymer cannot be sufficiently extended, and the strength and the elongation of the film tend to be lowered. In addition, when the NCO/OH is 3.0 or less, the flexibility can be sufficiently secured.

(Additive which can be Added to Tackiness Agent)

An additive to be usually used for resin, which includes, for instance, an ultraviolet absorber, an antioxidant, a filler, a pigment, a coloring agent, a fire retardant and an antistatic agent, can be added to a tackiness agent layer which constitutes a pressure-sensitive adhesive sheet, as needed, in such a range as not to obstruct the effect of the present invention. The usual amounts of these additives are used according to the type.

These additives may be added previously before the polymerization reaction of the polyisocyanate with the polyol, and may also be added before the urethane polymer is polymerized with the reactive monomer.

In addition, a small amount of a solvent may also be added to the tackiness agent for adjusting the viscosity to an adequate value for coating. The solvent can be appropriately selected from solvents to be usually used, but includes, for instance, ethyl acetate, toluene, chloroform and dimethylformamide.

(Manufacture of Pressure-Sensitive Adhesive Sheet)

In the present invention, the pressure-sensitive adhesive sheet can be formed by: making a polyol react with an isocyanate, for instance, in a radical-polymerizable monomer as was described above; applying a mixture of the urethane polymer and the radical-polymerizable monomer to a separator; and irradiating the wet film with an ionizing radiation such as α rays, β rays, γ rays, neutron rays and an electron beam, a radiation such as ultraviolet rays, a visible light and the like according to the type of the photopolymerization initiator and the like to photo-cure the wet film.

On this occasion, in order to avoid polymerization inhibition due to oxygen, a sheet which has been subjected to peeling treatment may be placed on the mixture of the urethane polymer and the radical-polymerizable monomer to block oxygen, which has been applied onto the separator, or the substrate may be put into a container to lower the oxygen concentration, which has been filled with an inactive gas. In the present invention, the type of a radiation and the like and the type of a lamp to be used for irradiation can be appropriately selected, and a usable lamp includes a low-pressure lamp such as a fluorescent chemical lamp, a black light and a bactericidal lamp, and a high-pressure lamp such as a metal halide lamp and a high-pressure mercury lamp. The amount of irradiation with ultraviolet rays and the like can be arbitrarily set according to characteristics to be required for a film.

The amount of irradiation with the ultraviolet rays is generally 100 to 5,000 mJ/cm$^2$, preferably is 1,000 to 4,000 mJ/cm$^2$, and further preferably is 2,000 to 3,000 mJ/cm$^2$. When the amount of irradiation with the ultraviolet rays is less than 100 mJ/cm$^2$, a sufficient polymerization ratio may not be obtained. When the amount of irradiation with the ultraviolet rays is more than 5,000 mJ/cm$^2$, the irradiation may cause degradation.

An ambient temperature at which the mixture is irradiated with the ultraviolet rays is not limited in particular, and can be arbitrarily set; but is usually 70° C. or lower, preferably is 50° C. or lower and further preferably is 30° C. or lower, because when the temperature is too high, a stop reaction tends to occur due to polymerization heat and the characteristics tend to be degraded.

A photopolymerization initiator is included in the mixture which contains the urethane polymer and the radical-polymerizable monomer as a main component. The photopolymerization initiator to be preferably used includes: a benzoin ether such as benzoin methyl ether and benzoin isopropyl ether; a substituted benzoin ether such as anisole methyl ether; a substituted acetophenone such as 2,2-diethoxyacetophenone and 2,2-dimethoxy-2-phenylacetophenone; a substituted α-ketol such as 1-hydroxy-cyclohexyl-phenylketone and 2-methyl-2-hydroxy propiophenone; an aromatic sulfonyl chloride such as 2-naphthalene sulfonyl chloride; and a photoactive oxime such as 1-phenyl-1,1-propanedione-2-(o-ethoxycarbonyl)-oxime.

In the present invention, a photopolymerization initiator having a hydroxyl group in the molecule is particularly desirably used. It is possible to introduce the photopolymerization initiator into the urethane polymer when the urethane polymer is formed by the reaction of a polyol with a polyisocyanate, by making the photopolymerization initiator having the hydroxyl group in the molecule coexist in the compounds. Thereby, when being cured by being irradiated with a radiation, the compounds can produce a urethane-acrylic block polymer. It is assumed that the elongation and the strength can be enhanced by this effect.

The pressure-sensitive adhesive sheet may be also blended with thermally expansive fine particles. A thermally foaming fine particle is a material which decreases the adhesion area by foaming of the thermally expansive fine particle by heat and facilitates the pressure-sensitive adhesive sheet to be peeled; and the thermally expansive fine particles preferably have an average particle diameter of approximately 1 µm to 25 µm, more preferably of 5 µm to 15 µm, and particularly preferably of approximately 10 µm. The thermally expansive fine particles can employ a material which expands by being heated, without particular limitation, but can employ a thermally expansive microcapsule which is formed by encapsulating an appropriate component of foaming a gas having a low-boiling point, for instance, such as butane, propane and pentane, with a shell wall of a copolymer such as vinylidene chloride and acrylonitrile, by an in-situ polymerizing method and the like. The thermally expansive microcapsule also has an advantage of being excellent in dispersibility in and miscibility with the above described tackiness agent. A commercial product of the thermally expansive microcapsule includes, for instance, Microsphere (trade name: made by Matsumoto Yushi-Seiyaku Co., Ltd.).

As for the amount of the thermally expansive fine particles (thermally expansive microcapsule) to be blended with respect to the above described pressure-sensitive adhesive sheet, an amount of being capable of decreasing the tack strength of the tackiness agent layer can be appropriately determined according to the type of the above described pressure-sensitive adhesive sheet, but is generally approximately 1 to 100 parts by weight with respect to 100 parts by weight of a base polymer, preferably is 5 to 50 parts by weight, and further preferably is 10 to 40 parts by weight.

The thickness of the pressure-sensitive adhesive sheet in the present invention can be appropriately selected according to the purpose and the like. Particularly when being used for working a precision component, the pressure-sensitive adhesive sheet is preferably 10 to 300 µm, and further preferably is approximately 50 to 250 µm. When being used as the other film, the pressure-sensitive adhesive sheet is preferably 10 to 300 µm, and further preferably is approximately 30 to 200 µm.

(Method of Using the Pressure-Sensitive Adhesive Sheet According to the Present Invention)

A pressure-sensitive adhesive sheet according to the present invention is used according to a conventional method, for instance, when a product such as a semiconductor wafer is worked. When the rear face of the semiconductor wafer is ground, the pressure-sensitive adhesive sheet protects the surface of the semiconductor wafer and can work as a protection sheet in fixing the wafer to a jig, or can be used also for an application of being affixed to the rear face of the semiconductor wafer so as to fix the rear face of the semiconductor wafer and the like to a substrate in a dicing operation.

Here, examples of being used when the rear face of the semiconductor wafer is ground will be described below. First, a semiconductor wafer is mounted on a table so that the pattern face of an IC circuit and the like faces upward, and the pressure-sensitive adhesive sheet of the present invention is placed on the pattern face so that the tackiness agent layer comes in contact with the pattern face, and is stuck while being pressed by pressing means such as a crimping roll. Alternatively, it is also acceptable to place the pressure-sensitive adhesive sheet on the semiconductor wafer as described above, lay the resultant wafer in a pressurizable container (autoclave, for instance), and then pressurize the inside of the container to stick the pressure-sensitive adhesive sheet to the semiconductor wafer, or also to concomitantly use the pressing means at this time. It is also acceptable to stick the pressure-sensitive adhesive sheet to the semiconductor wafer in a vacuum chamber, and also to stick the pressure-sensitive adhesive sheet to the semiconductor wafer by heating them at a temperature equal to or lower than the melting point of the substrate of the pressure-sensitive adhesive sheet.

A method of polishing and working the rear face of the semiconductor wafer can employ a usual grinding method. For instance, the rear face of the semiconductor wafer having the pressure-sensitive adhesive sheet stuck thereon as was described above is ground until the thickness reaches a desired thickness, by using a grinding machine (back grinding) as a working machine for polishing the rear face, a pad for CMP (Chemical Mechanical Polishing) and the like.

A separator which is used for the pressure-sensitive adhesive sheet according to the present invention needs a separator for protecting a face to be stuck onto an adherend, and occasionally needs a separator having unevenness thereon for transferring the unevenness onto the back face of the pressure-sensitive adhesive sheet to make the back face non-tacky. A material which constitutes these separators includes paper and a film of a synthetic resin such as polyethylene, polypropylene and polyethylene terephthalate. The separator may be also subjected to release treatment such as silicon treatment, long-chain alkyl treatment and fluorination treatment, as needed, in order to enhance peelability of the surface of the separator from the tackiness agent layer. The thickness of the separator is preferably 10 µm to 200 µm, and more preferably is 25 µm to 100 µm. The thickness accuracy of the separator is preferably ±2 µm or less.

The pressure-sensitive adhesive sheet according to the present invention can be affixed onto the wafer also by placing the tackiness agent layer of the pressure-sensitive adhesive sheet on the surface of the wafer in the pressurizable container (autoclave, for instance), and pressurizing the inside of the container. On this occasion, the pressure-sensitive adhesive sheet may be affixed onto the wafer also while being pressed by the pressing means. The pressure-sensitive adhesive sheet may be affixed onto the wafer also in the vacuum chamber, in a similar way to the above described description. The condition in affixing is not limited to the above conditions, but can include also heating the pressure-sensitive adhesive sheet when the pressure-sensitive adhesive sheet is affixed.

EXAMPLE

The present invention will be described in detail below with reference to Example, but the present invention is not limited to the example.

Example 1

A urethane polymer-acrylic monomer mixture was obtained by: charging 30 parts of t-butyl acrylate, 20 parts of acrylic acid, 80 parts of isobornyl acrylate as an acrylic monomer, 0.1 parts of 2,2-dimethoxy-1,2-diphenylethane-1-one (trade name "IRGACURE 651", made by Ciba Specialty Chemicals) as a photopolymerization initiator, 70 parts of polyoxytetramethylene glycol (molecular weight of 650, made by Mitsubishi Chemical Corporation) as a polyol, and 0.05 parts of dibutyltin dilaurate as a urethane reaction catalyst, into a reaction container provided with a cooling pipe, a thermometer and a stirring device; adding dropwise 25 parts of hydrogenated xylylene diisocyanate into the mixture while stirring the mixture; and making the compounds react with each other at 65° C. for 2 hours. In the above procedure, the used amounts of a polyisocyanate component and a polyol component were 1.25 by NCO/OH (equivalence ratio). After that, 5 parts of 2-hydroxyethyl acrylate were added to the monomer mixture.

A pressure-sensitive adhesive sheet was formed by: applying the urethane polymer-acrylic monomer mixture onto a polyethylene terephthalate film which had the thickness of 50 µm and was subjected to peeling treatment so that the thickness of the cured film became 100 µm; placing a polyethylene film (thickness of 70 µm) which had the uneven face subjected to peeling treatment, on the applied urethane polymer-acrylic monomer mixture, and making the film cover the mixture; and irradiating the covered mixture with ultraviolet rays (illumination of 163 mW/cm$^2$, and light quantity of 2,100 mJ/cm$^2$) by using a high-pressure mercury lamp to cure the mixture. After this, the covering polyethylene film was peeled which had the uneven face subjected to the peeling treatment, and a pressure-sensitive adhesive sheet was obtained which had the uneven face transferred and embossed on the back face thereof and was provided with a separator.

The pressure-sensitive adhesive sheet was affixed to the surface of an Si-wafer by using Tape Applicator DR-300011 (made by Nitto Seiki Co., Ltd.), and the rear face of the Si-wafer which had been fixed by the pressure-sensitive adhesive sheet was ground by using a grinder DFG8560 (made by DISCO Corporation) so that the Si wafer had the thickness of 50 µm. Then, the in-apparatus transportability of the wafer, the warpage of the ground wafer and the intrusion of water were evaluated. In addition, the percentage of stress relaxation, the change of step followability with elapsed time, and anchoring force of the produced pressure-sensitive adhesive sheet were measured.

Comparative Example 1

A pressure-sensitive adhesive sheet was produced with a similar method to that in Example 1, except that a usual PET separator (38 µm) having no unevenness thereon was used in place of the uneven separator used for covering the applied mixture in Example 1. This pressure-sensitive adhesive sheet was affixed onto the wafer in a similar method to that in Example 1, and the pressure-sensitive adhesive sheet and the wafer were evaluated.

Comparative Example 2

After 100 parts of n-butyl acrylate, 3 parts of acrylic acid and 0.1 parts of 2,2'-azobisisobutyronitrile were blended so that the whole weight became 200 g, the blend was charged in a state of 25° C. into a flask with 500 ml of an internal volume. The blend was stirred while nitrogen gas was introduced into the flask for approximately 1 hour, and the inside air was substituted with nitrogen. After that, the container was heated until the inside temperature reached 60° C. and was kept in this state for approximately 6 hours to polymerize the blend, and a polymer solution was obtained.

A tackiness agent solution was obtained by adding 2 g of a polyisocyanate compound (CORONATE L made by Nippon Polyurethane Industry Co., Ltd.) and 0.5 g of a polyfunctional epoxy compound (TETRAD C made by MITSUBISHI GAS CHEMICAL COMPANY, INC.) to 100 g of the obtained polymer solution, diluting the resultant solution with ethyl acetate and stirring the resultant solution until the content became uniform.

A pressure-sensitive adhesive sheet was produced by applying the obtained tackiness agent solution onto a PET separator, drying the solution at 70° C. and 130° C. for respective 3 minutes in a dry oven to form a tackiness agent layer having the thickness of 15 µm, and affixing the tackiness agent layer to EVA (ethylene-vinyl acetate copolymer film, thickness of 115 µm) which was a substrate. A pressure-sensitive adhesive sheet was produced with a similar method to that in Example 1, except that the tackiness agent was coated so that the thickness of the tackiness agent after drying became 30 µm in Example 1. This pressure-sensitive adhesive sheet was affixed onto the wafer with a similar method to that in Example 1, and the pressure-sensitive adhesive sheet and the wafer were evaluated.

[In-Apparatus Transportability of Wafer]

It was observed whether a back grinder DFG-8560 made by DISCO Corporation could transport the Si-wafer so that the back face of the pressure-sensitive adhesive sheet which had been affixed to the Si-wafer did not stick to a robot arm.

[Warpage of Wafer after Having been Ground]

The Si wafer was ground by the back grinder DFG-8560 made by DISCO Corporation so as to have the thickness of 50 µm. The warpage amount of the ground Si wafer was determined by laying the Si wafer which passed 1 minute after having been ground in a state of having been affixed to the pressure-sensitive adhesive sheet on a flat place, and by measuring a distance (mm) of a lifting height in the end.

The properties of the pressure-sensitive adhesive sheet were measured according to the following methods.

[Method for Measuring Anchoring Force]

The pressure-sensitive adhesive sheet having the width of 20 mm was affixed to a peeling tape for back grinding tape BT-315 (made by NITTO DENKO CORPORATION) at 23° C. so that the faces of the tackiness faces faced to each other, and the faces of the tackiness faces were peeled from each other at a speed of 300 mm/min so that the tackiness faces formed a T shape. Then, it was confirmed whether the tackiness faces caused anchorage rupture.

[Percentage of Stress Relaxation]

The pressure-sensitive adhesive sheet was extended by 10% at a speed of 200 mm/min and was retained in the state. Then, it was confirmed how much degree the strength after the sheet was retained for 1 minute was reduced in comparison with the initial strength.

[Evaluation for Step Lifting 1 Day after Tape Sticking and for Immersion into Water]

A step was prepared by previously sticking a tape having the width of 10 mm and the height of 30 µm on an Si mirror wafer, and the tape was stuck so as to intersect with the step by a tape applicator. Then, the lifting breadth of the step was evaluated in comparison with the increased amount after 1 day. The wafer was wholly immersed in water. When even a small amount of water intruded into the gap, the result was evaluated as "intrusion of water". When water did not intrude into the gap, the result was evaluated as "no problem".

The results of Example 1 and Comparative Examples 1 to 2 are shown in Table 1 and Table 2.

TABLE 1

|  | Step lifting after 1 day after tape sticking (%) | Water immersion result of step wafer after 1 day |
| --- | --- | --- |
| Example 1 | 4 | No problem |
| Comparative Example 1 | 4 | No problem |
| Comparative Example 2 | 60 | Intrusion of water |

TABLE 2

|  | Tape layer constitution | Measuring test for anchoring force | Percentage of stress relaxation (%) | Back face treatment (embossing treatment) | In-apparatus transportability | Warpage after grinding operation (mm) |
|---|---|---|---|---|---|---|
| Example 1 | Single layer | No anchorage rupture | 90 | Present | Acceptable | 1.9 |
| Comparative Example 1 | Single layer | No anchorage rupture | 90 | Absent | Unacceptable | Impracticable |
| Comparative Example 2 | Substrate/ tackiness agent | Anchorage rupture | 11 | Present | Acceptable | 15 |

As is shown in Table 1 and Table 2, in Example 1 in which the pressure-sensitive adhesive sheet that does not have an interface between a substrate and a tackiness agent and is made of one layer has been used, the step lifting after one day after tape sticking is very small, and water does not intrude into a gap between the tape and the step even when the wafer has been immersed in water. Accordingly, water does not intrude into the gap even when the wafer is back-ground after several days after the tape sticking. In addition, also in the anchoring force test, the pressure-sensitive adhesive sheet does not cause the anchorage rupture, because of having no interface between the substrate and the tackiness agent and being made of one layer, and does not cause a problem of leaving the tackiness agent and the like when the tape is peeled from the wafer. Further, the pressure-sensitive adhesive sheet does not cling to an arm even when the wafer is transported by a robot when being ground by making the back face embossed, the wafer can be stably transported, and the warpage occurring in the wafer when the wafer is ground to be extremely thin can be reduced to the limit.

What is claimed is:

1. A pressure-sensitive adhesive sheet for a semiconductor wafer, which is affixed onto the surface of the semiconductor wafer, the pressure-sensitive adhesive sheet being made of one layer formed of an acrylic urethane resin, and without having a substrate layer existing in the pressure-sensitive adhesive sheet,
    wherein when the pressure-sensitive adhesive sheet has been stuck to a step having a height of 30 μm, the lifting breadth of a tape after 24 hours shows an increase ratio of 40% or less compared to that in an initial state.

2. The pressure-sensitive adhesive sheet for the semiconductor wafer according to claim 1, wherein the pressure-sensitive adhesive sheet has a percentage of stress relaxation of 40% or more in an extension of 10%.

3. The pressure-sensitive adhesive sheet for the semiconductor wafer according to any one of claims 1 to 2, wherein the pressure-sensitive adhesive sheet has a thickness of 5 μm to 1,000 μm.

4. The pressure-sensitive adhesive sheet for the semiconductor wafer according to any one of claims 1 to 2, wherein the pressure-sensitive adhesive sheet has different tack strengths on both faces from each other.

5. The pressure-sensitive adhesive sheet for the semiconductor wafer according to claim 4, wherein the pressure-sensitive adhesive sheet has a thickness of 5 μm to 1,000 μm.

* * * * *